United States Patent
Lee et al.

(10) Patent No.: US 10,951,163 B1
(45) Date of Patent: Mar. 16, 2021

(54) METHOD FOR LOW-CURRENT OSCILLATORY CIRCUIT WITH WIDE OPERATION VOLTAGE AND TEMPERATURE COMPENSATION

(71) Applicants: Dyna Image Corporation, New Taipei (TW); Lite-On Semiconductor Corp., Taipei (TW)

(72) Inventors: Sheng-Cheng Lee, New Taipei (TW); Wen-Sheng Lin, New Taipei (TW); Yu-Cheng Su, Taipei (TW); Chun-Hsien Lin, New Taipei (TW); Peng-Han Chan, New Taipei (TW)

(73) Assignees: Dyna Image Corporation, New Taipei (TW); Lite-On Semiconductor Corp., Taipei (TW)

( * ) Notice: Subject to any disclaimer, the term of this patent is extended or adjusted under 35 U.S.C. 154(b) by 0 days.

(21) Appl. No.: 16/827,971

(22) Filed: Mar. 24, 2020

(51) Int. Cl.
  *H03B 5/04* (2006.01)
  *G06N 5/04* (2006.01)
  *G06N 20/00* (2019.01)

(52) U.S. Cl.
  CPC .......... *H03B 5/04* (2013.01); *G06N 5/04* (2013.01); *G06N 20/00* (2019.01); *H03B 2200/0056* (2013.01)

(58) Field of Classification Search
  CPC ........................................ H03V 5/04
  USPC ........................................ 331/66
  See application file for complete search history.

(56) References Cited

U.S. PATENT DOCUMENTS

2018/0183442 A1\* 6/2018 Pavao Moreira ....... H03L 1/023
2019/0305725 A1\* 10/2019 Voor ........................ H03B 5/36

\* cited by examiner

*Primary Examiner* — Joseph Chang
(74) *Attorney, Agent, or Firm* — JCIPRNET (57) ABSTRACT

A smart method is provided for a low-current oscillatory circuitry. The circuitry comprises an oscillator and a microcontroller unit (MCU). The oscillator comprises a proportional-to-absolute-temperature circuit connecting to a low-voltage regulator. The low-voltage regulator connects to a PMOS diode array and a delay unit circuit. The PMOS diode array connects to the MCU. The delay unit circuit connects to the MCU and a voltage converter. The method includes a normal temperature compensation algorithm; a smart learning algorithm of extra-high temperature compensation; and an ultra-high temperature compensation algorithm. Thus, clock variations are compensated; output frequency is stable and not affected by voltage or temperature variations; and process variations are suppressed. When process variations appear, there are not be too many errors generated. Therefore, a timebase clock is provided with high accuracy, wide operating voltage range, wide operating temperature range, and low power consumption operation.

8 Claims, 10 Drawing Sheets

METHOD FOR LOW-CURRENT OSCILLATORY CIRCUIT WITH WIDE OPERATION VOLTAGE AND TEMPERATURE COMPENSATION

TECHNICAL FIELD OF THE INVENTION

The present invention relates to a low-current oscillatory circuit; more particularly, to compensating clock variations, stabilizing output frequency without being affected by voltage, temperature and process variations, where a time base clock with high accuracy, wide operating voltage range, wide operating temperature range, and low power consumption operation is provided.

DESCRIPTION OF THE RELATED ARTS

In a wide range of Internet of Things (IoT) applications, the most widely used are smart home ones, because family is the closest to people's lives. The combinations of daily life affairs and IoT starts from IoT devices to integrated system and, then, extend to platforms and services. This process continuously meets the needs of consumers. Regardless of protocols, a wide variety of sensors are applied. The applications of such sensors are mostly battery powers. Hence, low power consumption is a major demand. These sensors are always on to monitor external information. In an energy-saving system, it essentially requires two system clocks including an operation clock and a time base clock. For the timebase clock, it requires high accuracy, wide operating voltage range, wide operating temperature range, and low power consumption operation.

The methods for operating sensors include traditional-driven sensor operations and event-driven sensor operations. The event-driven sensor system divides the energy-saving time into a sleeping mode, a monitoring mode, a data-collecting and processing mode. The sleeping mode decrease total system power with a timer, whose precision determines the protection period; for different communication protocols, the monitoring mode stably starts a simulation circuit during the protection period; and, the data-collecting and processing mode collects and processes data. The energy efficiencies of the traditional-driven sensor operation and the event-driven sensor operation are compared: the event-driven sensor applies low duty cycle usage during the period and the total system power consumption is saved; however it requires a low-power sleeping (timebase) clock to support the sleeping mode.

Within the present relevant prior arts, U.S. Pat. No. 8,497,741 B2 reveals a high accuracy RC oscillator. A reference clock is used to provide coarse and fine vector tuning for generating 64/32/1 KHz frequency. Proportional to absolute temperature (PTAT) and complementary to absolute temperature (CTAT) circuits are combined to generate reference voltage for compensating clock temperature variation. Two-point calibration is used to obtain temperature message and then clock generator calibration is processed. This patent uses clock generator's exceeding-temperature variation for calibration and it is only a general two-point calibration. Patent US 0327486 A1 reveals a resistor-capacitor (RC) oscillator. It uses inverter parameters having fewer process variations to follow local voltage of unit buffer for fewer variations of local voltage in process variations. A special casting process is used to break the relationship between resistance and temperature, which only fine-tunes capacitance to obtain a high-precision clock. This patent uses inverter to delay time with smaller variations by voltage and temperature. The local voltage varies by following MOS threshold voltage. The positive and negative capacitors are charged under a given frequency for halving the capacitor area. A first related document (K.-J. Hsiao, "A 32.4 ppm/° C. 3.2-1.6V Self-chopped Relaxation Oscillator with Adaptive Supply Generation," in VLSI Circuits Symp. Dig. Tech. Paper, June, 2012. pp. 14-15.) proposed a self-chopped oscillator. A self-adaptive voltage was used to generate a timebase clock to reduce temperature and voltage variation of the timebase clock. A second related document (S. C. Lee, et al., "A 53.4-µW CMOS temperature sensor with an inaccuracy of ±1.9° C. (3σ) from −65° C. to 165° C.," IEEE Sensors, October 2011.) used a MOS diode array to generate leakage current for compensating high-temperature effect and extending operating range of sensor. As shown in the result for the temperature sensor, a single-point calibration had an error reproducibility accuracy (3σ) under 25° C. A third related document (Y. Lee, et al., "A Sub-nW Multi-stage Temperature Compensated Timer for Ultra-Low-Power Sensor Nodes," IEEE J. Solid-State Circuits, vol. 48, no. 10, pp. 2511-2521, October 2013.) used two types of high/low P/Z ratios (leakage current) for minimizing second order temperature effect. The above three documents did not effectively solve related defectiveness, Hence, the prior arts do not fulfill all users' requests on actual use.

SUMMARY OF THE INVENTION

The main purpose of the present invention is to compensate clock variations, stabilize output frequency without being affected by voltage, temperature and process variations, where a time base clock with high accuracy, wide operating voltage range, wide operating temperature range, and low power consumption operation is provided.

To achieve the above purposes, the present invention is a method for a low-current oscillatory circuit with wide operation voltage and temperature compensation, where the oscillatory circuitry uses the method and the oscillatory circuitry comprises an oscillator, a memory, a temperature sensor, and a micro controller unit (MCU); the MCU connects to the oscillator, the memory, and the temperature sensor; the oscillator further comprises a PTAT circuit and connects to a low-voltage regulator; the low-voltage regulator connects to a PMOS diode array; the PMOS diode array comprises a plurality of parallel connected PMOS diodes; the PMOS diode array connects to the MCU; a delay unit circuit is connected after the low-voltage regulator; and the delay unit circuit connects to the MCU and a voltage converter, separately; where the method comprises a smart learning algorithm of ultra-high temperature compensation and the smart learning algorithm of ultra-high temperature compensation comprises steps of: (a1) starting the temperature sensor to sense a temperature; (b1) when the temperature is higher than a threshold, using the MCU to check whether the timebase clock is conformed to calibration specifications; if yes, ending calibration; and, if not, processing the next step (c1), where the threshold is a temperature of 85·180° C.; (c1) finding relationship between the timebase clock and an assigned clock by the MCU to adjust parameters, where a present bit of the PMOS diode array is set to be 1; when the timebase clock is smaller than the assigned clock, the present bit is confirmed to be set as 1; and, when the timebase clock is bigger than the assigned clock, the present bit is confirmed to be set as 0; where the MCU checks and adjusts the PMOS diode array to obtain varied leakage currents to compensate clock variations, where the PTAT circuit is used to generate currents having positive correlation to temperature to be injected into an internal circuit of the low-voltage regulator; the low-voltage regulator changes by following process variations and generates varied low stable voltages to the delay unit circuit; and, at last, the delay unit circuit generates assigned clock outputs; and (d1) checking whether the PMOS diode array is adjusted till a last bit; if not, processing step (b1); and, if yes, under an editing mode, storing data of the PMOS diodes into the memory and building a look-up table to end calibration, where the look-up table is applied to process next compensation. Accordingly, a novel method for a low-current oscillatory circuit with wide operation voltage and temperature compensation is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
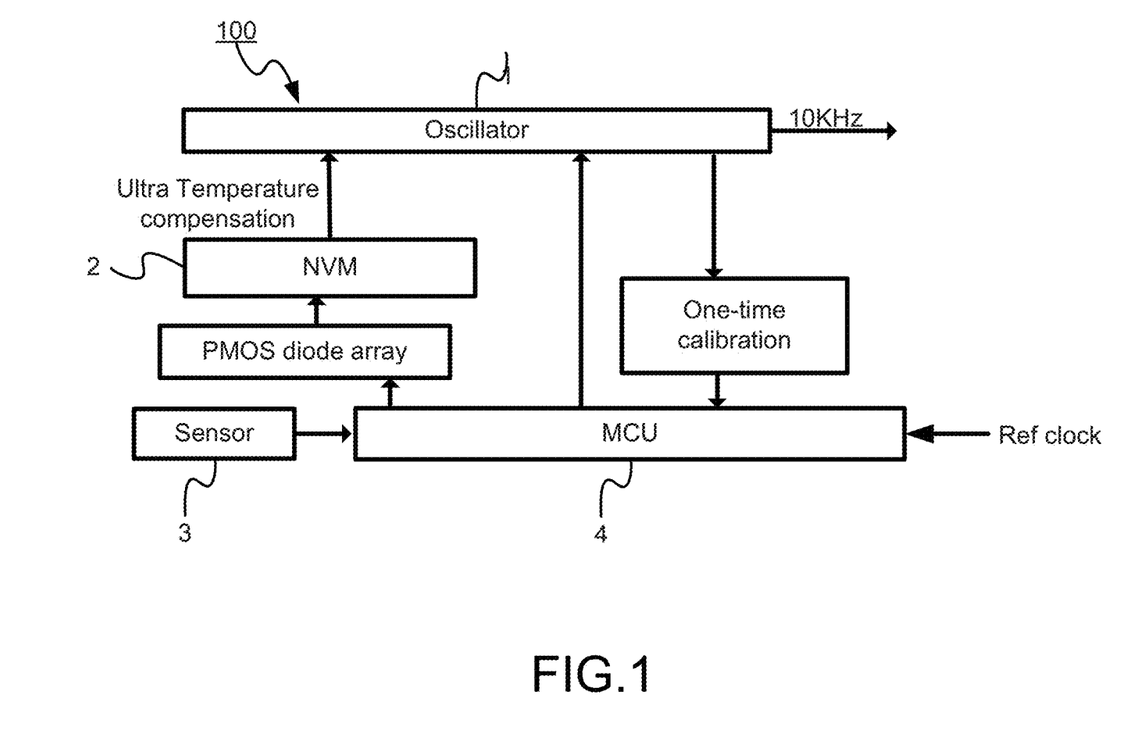
FIG. 1 is the structural view showing the preferred embodiment according to the present invention.
Figure 2:
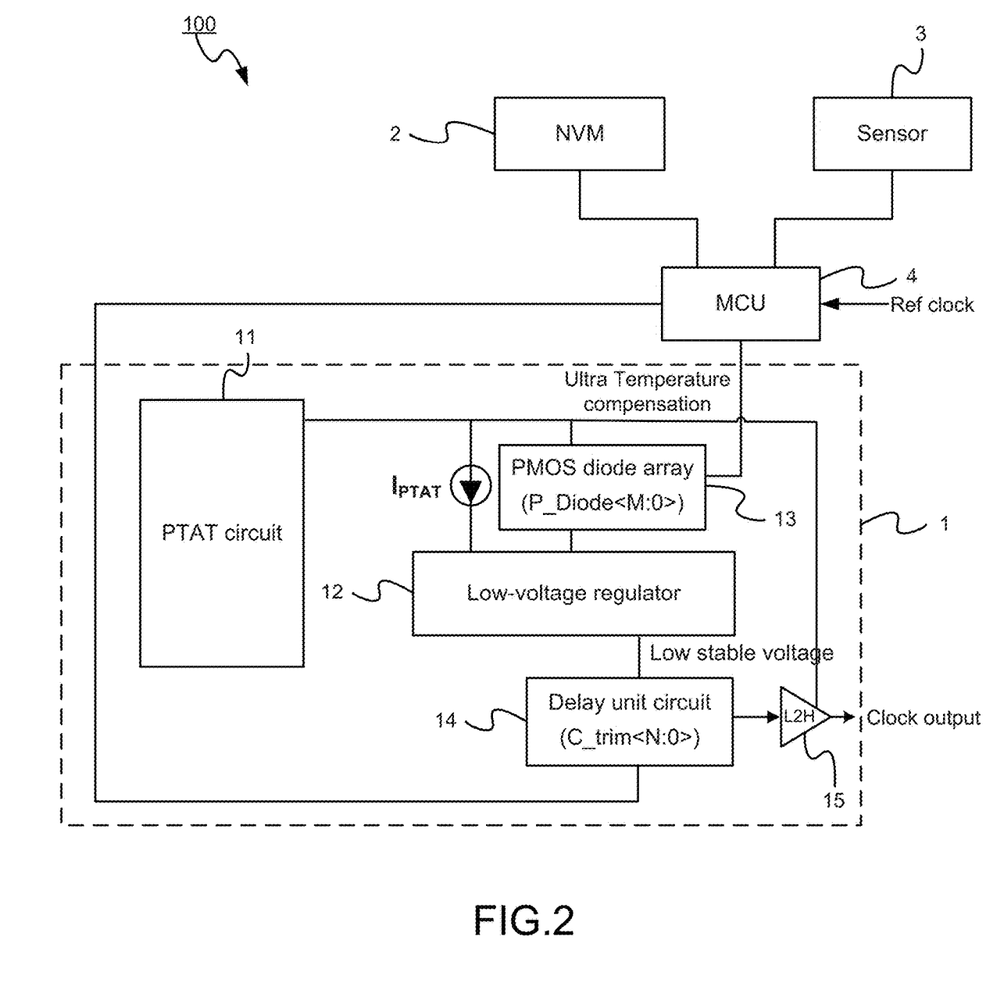
FIG. 2 is the view showing the hardware structure.
Figure 3:
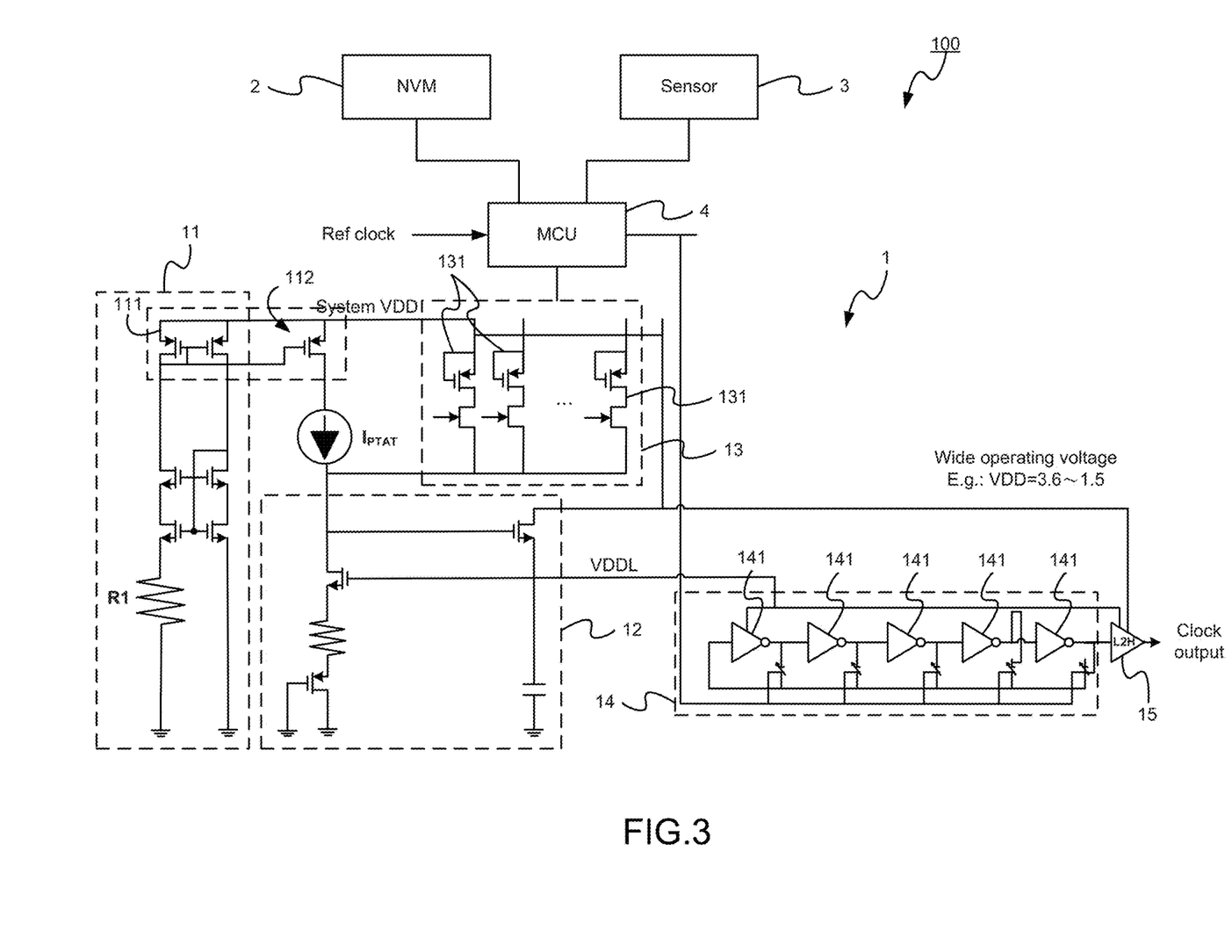
FIG. 3 is the view showing the circuit.

Please refer to FIG. 1 to FIG. 10, which are a structural view showing a preferred embodiment according to the present invention; a view showing a hardware structure; a view showing a circuit; a flow view showing a normal compensation algorithm; a flow view showing a smart learning algorithm of ultra-high temperature compensation; a flow view showing an ultra-high temperature compensation; a view showing time courses under an ultra-high temperature compensation; a view showing voltage outputs of a low-voltage regulator; a view showing compensation results with/without diodes; and a view showing system voltages and voltage outputs of a low-voltage regulator for process variations. As shown in the figures, the present invention is a method for a low-current oscillatory circuit with wide operation voltage and temperature compensation, where an oscillatory circuitry 100 uses the method, as shown in FIG. 1. The oscillatory circuitry 100 comprises an oscillator 1, a non-volatile memory (NVM) 2, a temperature sensor 3, and a microcontroller unit (MCU) 4 connecting to the oscillator 1, the NVM 2, and the temperature sensor 3. A hardware structure and a circuit are shown in FIG. 2 and FIG. 3. The oscillator 1 further comprises a proportional-to-absolute-temperature (PTAT) circuit 11 comprising a PTAT current generator 111 and a current mirror 112 and connecting to a low-voltage regulator 12. The low-voltage regulator 12 connects to a PMOS diode array 13 comprising a plurality of parallel connected PMOS diodes (P_Diode<M:0>). The PMOS diode array 13 connects to the MCU 4. A delay unit circuit 14, which comprises a plurality of inverters 141 serially connected with a capacitor array, is connected after the low-voltage regulator 12. The delay unit circuit 14 connects to the MCU 4 and a voltage converter 15 (L2H), separately.

Figure 4:
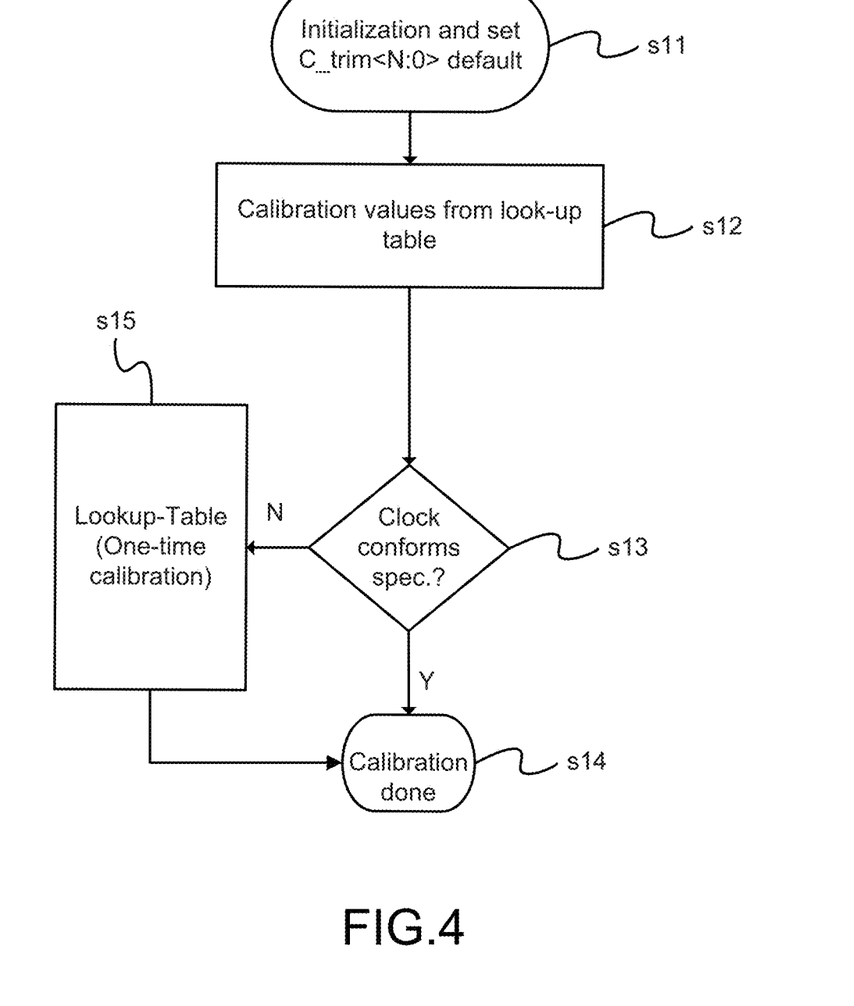
FIG. 4 is the flow view showing the normal compensation algorithm.

As shown in FIG. 4, the present invention at least comprises a normal temperature compensation algorithm comprising the following steps:

(a2) In Process s11, the whole system is initialized and default values of the delay unit circuit 14 are set.

(b2) In Process s12 and s13, calibration specifications are obtained from a look-up table and adjustment values of the look-up table are used to check whether a timebase clock is conformed to the calibration specifications. If yes, Process s14 is processed to end calibration. If not, Process s15 is processed.

(c2) Matching is processed by using a Brute-Force search method to find the adjustment values conformed to the calibration specifications through one-shot calibration and, at last, Process s14 is processed to end calibration.

Figure 5:
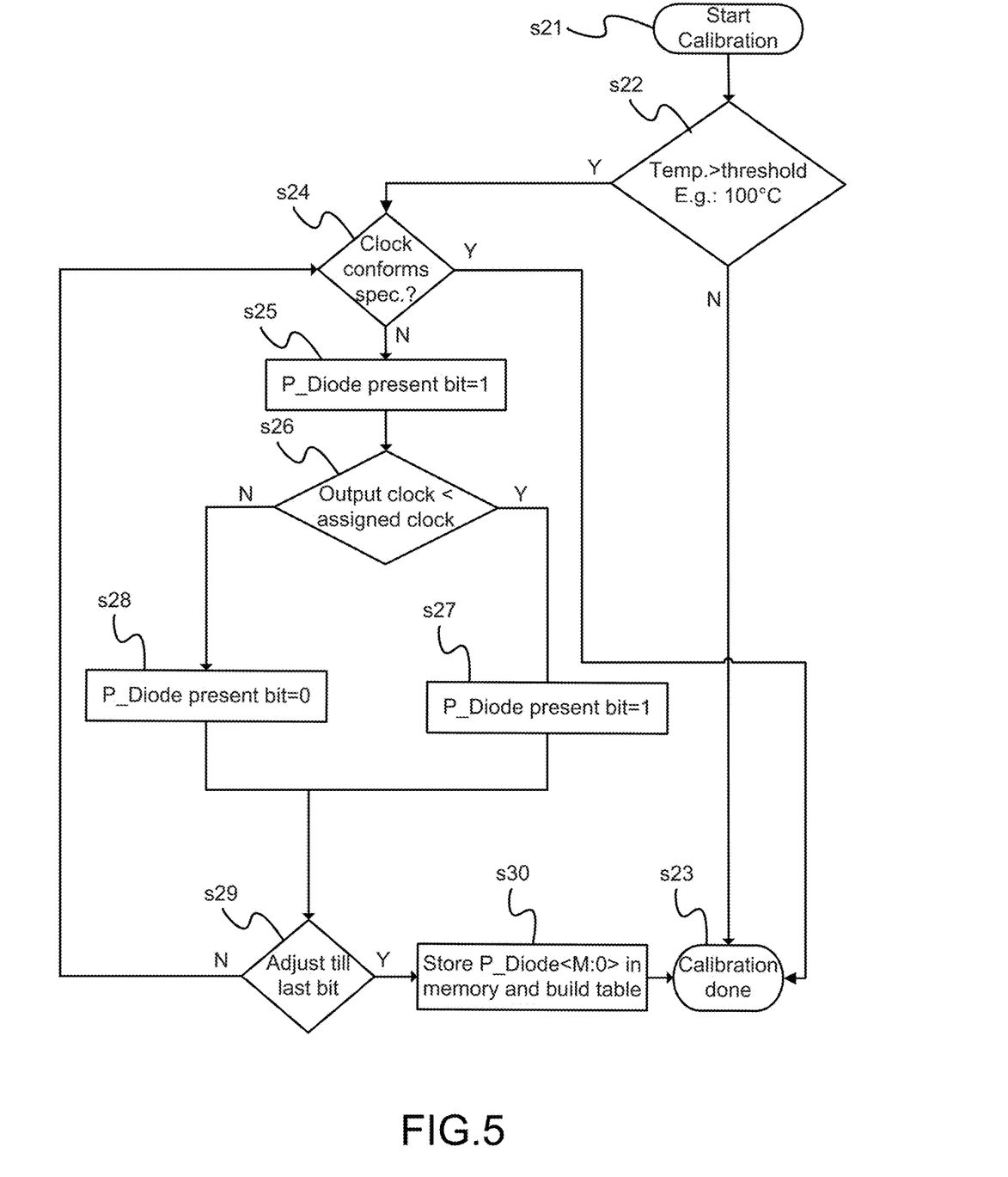
FIG. 5 is the flow view showing the smart learning algorithm of ultra-high temperature compensation.

As shown in FIG. 5, the present invention further comprises a smart learning algorithm of ultra-high temperature compensation comprising the following steps:

(a1) In Process s21, the temperature sensor 3 starts to sense a temperature.

(b1) In Process s22, whether the temperature is higher than 100° C. is checked. If the temperature is lower than 100° C., Process s23 is processed to end calibration. If the temperature is higher than 100° C., Process s24 is processed to find whether the timebase clock is conformed to the calibration specifications. if yes, no calibration is needed and Process s23 is processed to end calibration. If not, Process s25 and s26 are processed.

(c1) The MCU 4 finds a relationship between the timebase clock and an assigned clock to adjust the bits of the PMOS diode array 13. A present bit of the PMOS diode array 13 is set to be 1. When the timebase clock is smaller than the assigned clock, the present bit is confirmed to be set as 1 in Process s27. When the timebase clock is bigger than the assigned clock, the present bit is confirmed to be set as 0 in Process s28. Therein, the MCU checks and adjusts the PMOS diode array 13 to obtain varied leakage currents for compensating clock variations. The oscillator 1 uses a PTAT current generator 111 of the PTAT circuit 11 to generate currents having positive correlation to temperature. The currents are converted by the current mirror 112 and, then, injected into an internal circuit of the low-voltage regulator 12. The low-voltage regulator 12 changes by following process variations and generates varied low stable voltages to the delay unit circuit 14. Then, the delay unit circuit 14 generates assigned clock outputs and a voltage converter 15 converts the assigned clock outputs into system voltages (VDD), where, for example, 1.1V is converted into a system voltage (3.6-1.5V), depending on an end-user demand.

(d1) Then, in Process s29, whether the PMOS diode array 13 is adjusted till a last bit is checked. If not, Process s24 is processed backwardly. If yes, Process s30 is processed, where, under an editing mode, data of the PMOS diode array are stored in the memory and a look-up table is built for processing next compensation. Then, Process s23 is processed to end calibration.

Figure 6:
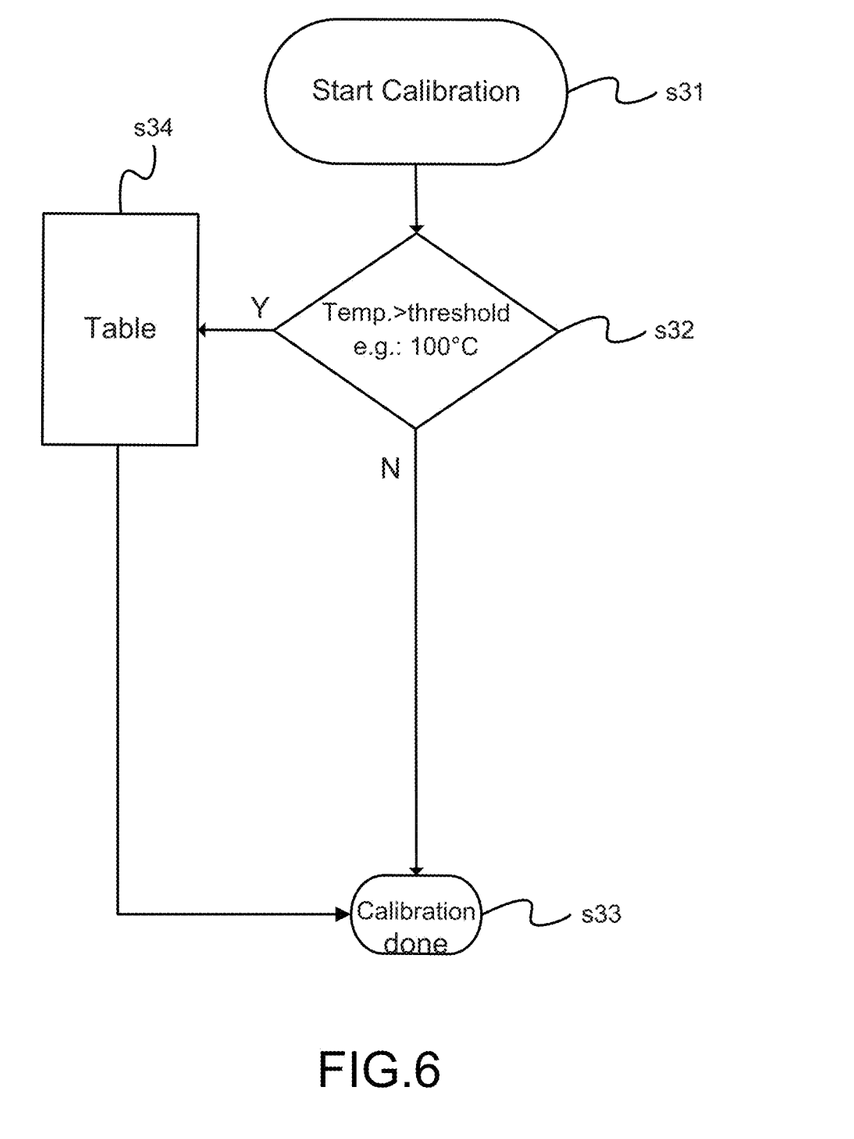
FIG. 6 is the flow view showing the ultra-high temperature compensation.

When the clock outputs of the smart learning algorithm of ultra-high temperature compensation are not conformed to the calibration specifications, the ultra-high temperature compensation as shown in FIG. 6 is processed, comprising the following steps:

In Process s31, the temperature sensor 3 starts to sense a temperature. In Process s32, whether the temperature is higher than 100° C. is checked. If the temperature is lower than 100° C., Process s33 is processed to end calibration. If the temperature is higher than 100° C., Process s34 is processed where the smart learning algorithm of ultra-high temperature compensation is processed again to adjust the look-up table.

The present invention builds the look-up table of high temperature compensation for a one-time compensation at the first time. All data are stored in the NVM 2. Then, for improving precision, the sensors can process multiple times of calibration for practicing the smart learning algorithm.

Thus, a novel method for a low-current oscillatory circuit with wide operation voltage and temperature compensation is obtained.

Figure 7:
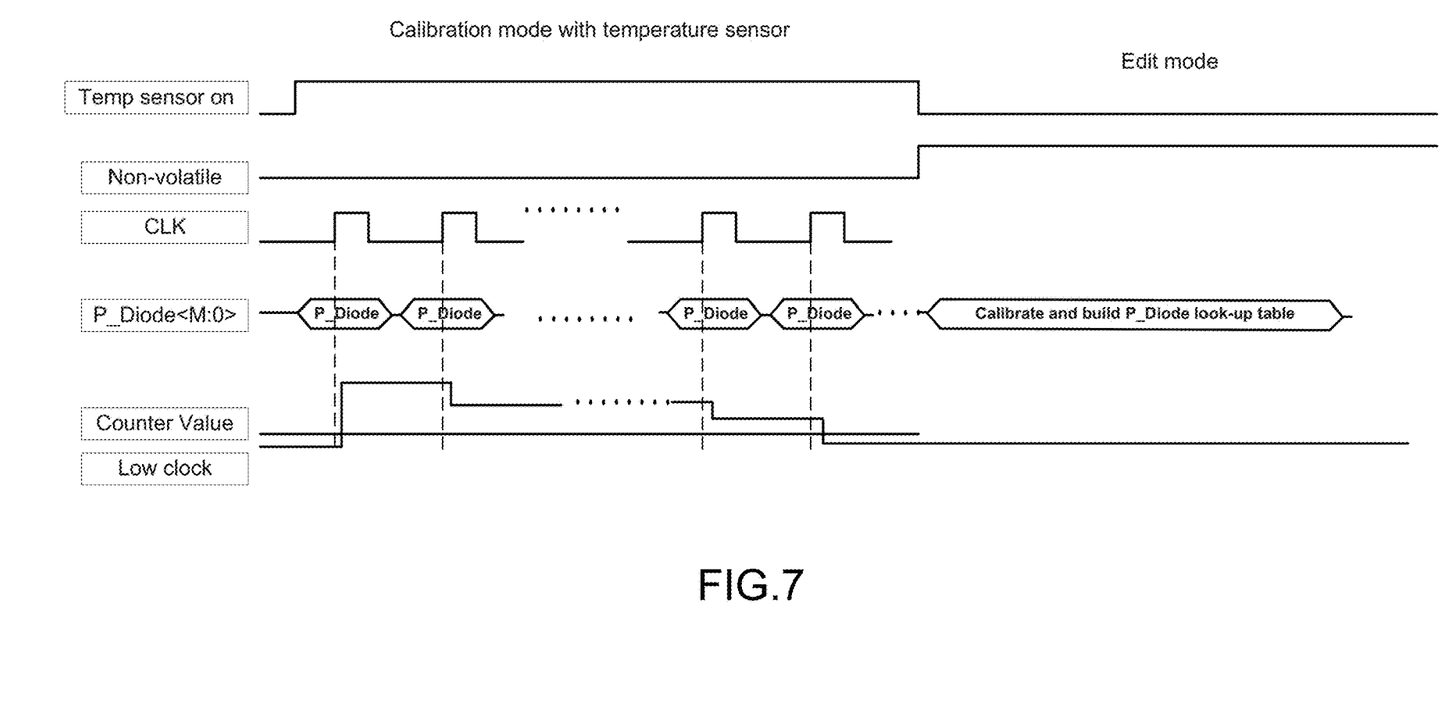
FIG. 7 is the view showing the time courses under the ultra-high temperature compensation.

FIG. 7 shows time courses under the ultra-high compensation for a calibration mode and an editing mode. In the figure, 'temp sensor on' happens when the temperature is too high, i.e. when calibration is processed; 'non-volatile' is the non-volatile memory; 'CLK' is the reference clock for the MCU; 'P_Diode<M:0>' is the control signal of the PMOS diode; 'Counter Value' is a count number of calibration; and 'Low clock' is the actual output, e.g., 10 KHz shown in FIG. 1.

Figure 8:
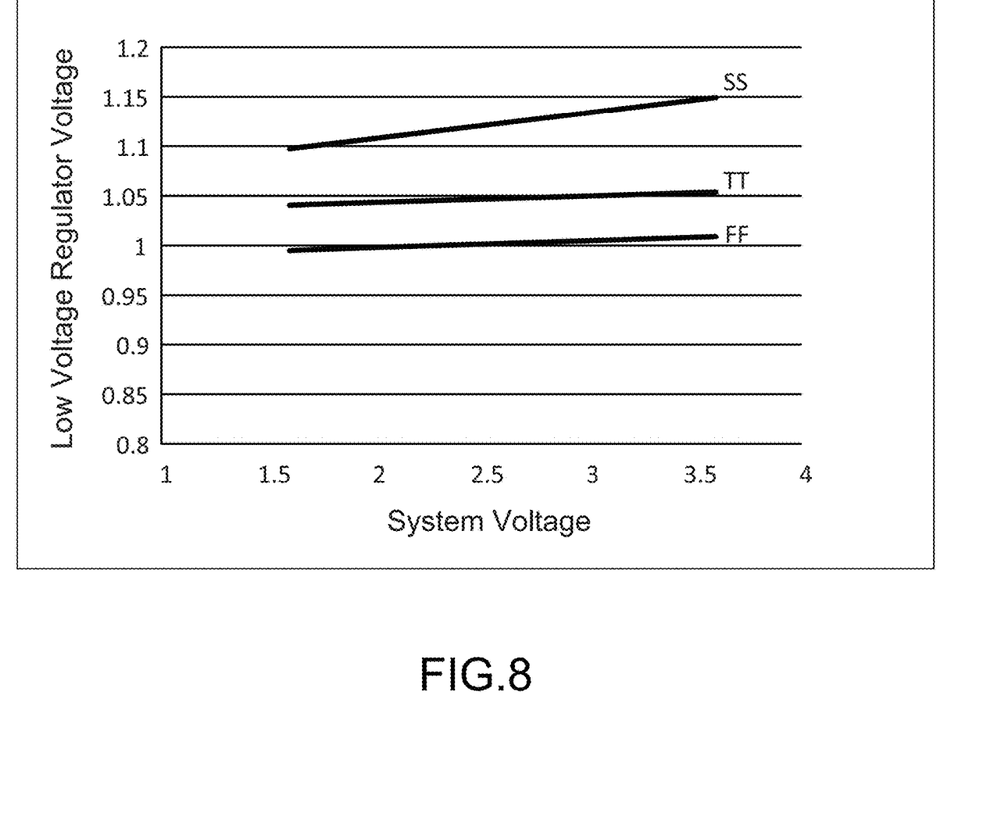
FIG. 8 is the view showing the voltage outputs of the low-voltage regulator.

FIG. 8 shows voltage outputs of the low-voltage regulator. Under process variations of SS/TT/FF, the relationships between the system voltages (VDD) and the low-voltage regulator voltages are shown. As shown in the figure, the present invention is affected by the process variations. Even under the worst SS status, the present invention automatically processes calibrations and compensations.

Figure 9:
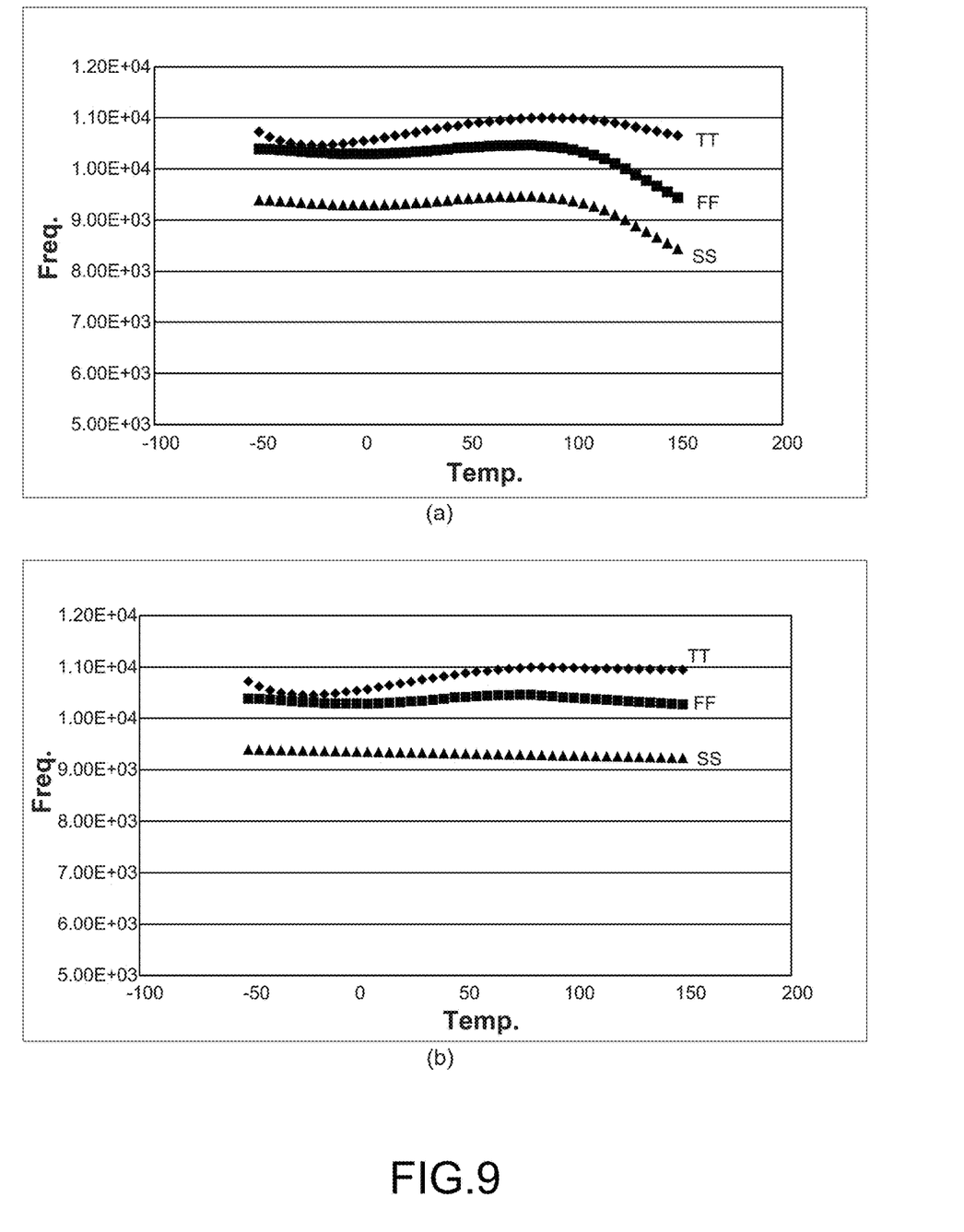
FIG. 9 is the view showing the compensation results with/without the diodes.

FIG. 9 shows the compensation results with/without the diodes. Diagram (a) shows the relationship between frequency and temperature without PMOS diode compensation; and diagram (b) shows the relationship between frequency and temperature with PMOS diode compensation. As shown in the figure, a control in diagram (a) shows a greatly reduced frequency affected by temperature owing to the lack of compensation. With the help of compensation where the PMOS diode in diagram (b) compensates clock output with leakage current at 100° C., the frequency is not affected by temperature and the curve is smooth.

Figure 10:
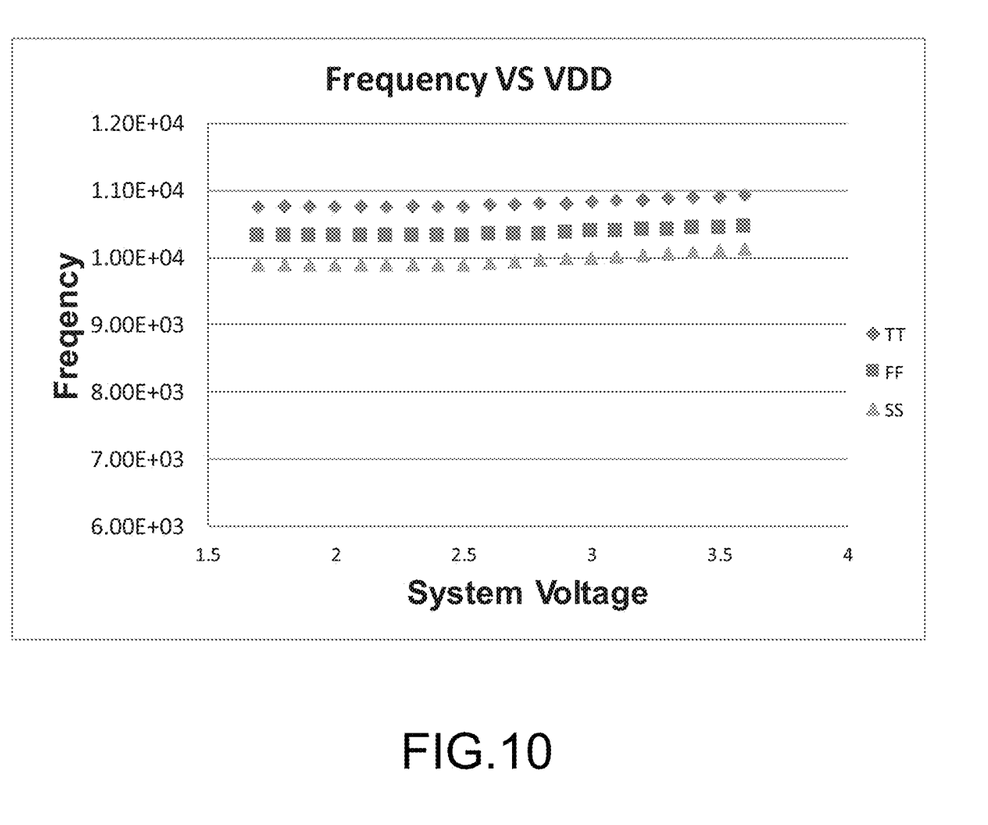
FIG. 10 is the view showing the system voltages and the voltage outputs of the low-voltage regulator for the process variations.

FIG. 10 shows the system voltages (VDD) under different process variations. The frequency is not changed with voltage. Through the control bits of the delay unit circuit, the frequency is adjusted to fit requirement.

The present invention uses the following technologies:
1. The PTAT circuit is used to generate currents having positive correlation to temperature Then, the currents are converted by the current mirror to be injected into the internal circuit of the low-voltage regulator.
2. The internal circuit of the low-voltage regulator changes by following process variations and generates varied low stable voltages to the delay unit circuit.
3. Under a high-temperature operation above 100° C., the embedded MCU checks and adjusts the PMOS diode array to obtain varied leakage currents to compensate clock variations; and, under an editing mode, a look-up table is built for next compensation and, thus, an ultra-high temperature operation extended is achieved.
4. The smart learning algorithm extends clock for operation under ultra-high temperature.

The present invention has the following effects:
1. The low-voltage regulator is used to extend operating voltage range and effectively reduce power consumption.
2. The one-shot calibration under the normal temperature mode is used to effectively reduce the wafer-level testing time.
3. The leakage currents of the PMOS diode array increases exponentially to find the most suitable compensation target to be applied under high temperature.
4. The real-time temperature sensor with the PMOS diode array compensates the effect of high-temperature to extend clock in operation of ultra-high temperature.

To sum up, the present invention is a method for a low-current oscillatory circuit with wide operation voltage and temperature compensation, where clock variations are compensated; output frequency is stable and not affected by voltage or temperature variations and, at the same time, process variations can be suppressed; when process variations appear, there would not be too many errors generated by applying the present invention; and, therefore, the present invention provides a timebase clock with high accuracy, wide operating voltage range, wide operating temperature range, and low power consumption operation.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method for a low-current oscillatory circuit with wide operation voltage and temperature compensation,
   wherein said oscillatory circuitry uses the method and said oscillatory circuitry comprises an oscillator, a memory, a temperature sensor, and a microcontroller unit (MCU); said MCU connects to said oscillator, said memory, and said temperature sensor; said oscillator further comprises a proportional-to-absolute-temperature (PTAT) circuit and connects to a low-voltage regulator; said low-voltage regulator connects to a PMOS diode array; said PMOS diode array comprises a plurality of parallel connected PMOS diodes; said PMOS diode array connects to said MCU; a delay unit circuit is connected after said low-voltage regulator; and said delay unit circuit connects to said MCU and a voltage converter, separately; and
   wherein the method comprises a smart learning algorithm of ultra-high temperature compensation, comprising steps of:
   (a1) starting said temperature sensor to sense a temperature;
   (b1) when said temperature is higher than a threshold, using said MCU to check whether said timebase clock is conformed to calibration specifications; if yes, ending calibration; and, if not, processing the next step (c1),
      wherein said threshold is a temperature of 85·180° C.;
   (c1) finding relationship between said timebase clock and an assigned clock by said MCU to adjust parameters,
      wherein a present bit of said PMOS diode array is set to be 1; when said timebase clock is smaller than said assigned clock, said present bit is confirmed to be set as 1; and, when said timebase clock is greater than said assigned clock, said present bit is confirmed to be set as 0; and wherein said MCU checks and adjusts said PMOS diode array to obtain varied leakage currents to compensate clock variations, wherein said PTAT circuit is used to generate currents having positive correlation to temperature to be injected into an internal circuit of said low-voltage regulator; said low-voltage regulator changes by following process variations and generates varied low stable voltages to said delay unit circuit; and, at last, said delay unit circuit generates assigned clock outputs; and (d1) checking whether said PMOS diode array is adjusted till a last bit; if not, processing step (b1); and, if yes, storing data of said PMOS diodes into said memory under an editing mode and building a look-up table to end calibration, wherein said look-up table is applied to process next compensation.

2. The method according to claim 1,
wherein said PTAT circuit comprises a PTAT current generator and a current mirror; said oscillator uses said PTAT current generator to generate a current having positive correlation to temperature; and said current is converted by said current mirror to be injected into said internal circuit of said low-voltage regulator.

3. The method according to claim 1,
wherein said delay unit circuit comprises a plurality of inverters serially connected with a capacitor array.

4. The method according to claim 1,
wherein the method further comprises a normal temperature compensation algorithm, comprising steps of:
   (a2) processing initialization and setting default values of said delay unit circuit;
   (b2) using adjustment values of said look-up table to check whether said timebase clock is conformed to said calibration specifications; if yes, ending calibration; and, if not, processing the next step (c2); and
   (c2) processing matching by using a Brute-Force search method to find said adjustment values conformed to said calibration specifications through one-shot calibration and ending calibration.

5. The method according to claim 1,
wherein, when said clock outputs of said smart learning algorithm of ultra-high temperature compensation are not conformed to said calibration specifications, processing said smart learning algorithm of ultra-high temperature compensation again to adjust said look-up table.

6. The method according to claim 1,
wherein said voltage converter converts said assigned clock outputs generated by said delay unit circuit into system voltages (VDD).

7. The method according to claim 1,
wherein said memory is a non-volatile memory (NVM).

8. The method according to claim 7,
wherein said NVM is a flash memory.

\* \* \* \* \*